United States Patent
Matsuda et al.

(10) Patent No.: US 6,853,582 B1
(45) Date of Patent: Feb. 8, 2005

(54) NONVOLATILE MEMORY WITH CONTROLLED VOLTAGE BOOSTING SPEED

(75) Inventors: Yuki Matsuda, Pasadena, CA (US); Tadashi Oda, Tomakomai (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 78 days.

(21) Appl. No.: 10/312,014
(22) PCT Filed: Aug. 30, 2000
(86) PCT No.: PCT/JP00/05860
§ 371 (c)(1), (2), (4) Date: Dec. 23, 2002
(87) PCT Pub. No.: WO02/19342
PCT Pub. Date: Mar. 7, 2002

(51) Int. Cl.[7] .............................................. G11C 16/04
(52) U.S. Cl. ............................ 365/185.18; 365/185.27; 365/185.29
(58) Field of Search ....................... 365/185.18, 185.27, 365/185.29, 185.01

(56) References Cited

U.S. PATENT DOCUMENTS

| 5,404,338 A | * | 4/1995 | Murai et al. | 365/233 |
| 5,825,689 A | * | 10/1998 | Wakita | 365/185.11 |
| 6,011,725 A | * | 1/2000 | Eitan | 365/185.33 |
| 6,208,200 B1 | * | 3/2001 | Arakawa | 327/589 |

FOREIGN PATENT DOCUMENTS

| JP | 59-211281 | 11/1984 |
| JP | 2-123599 | 5/1990 |
| JP | 2-161694 | 6/1990 |
| JP | 7-130190 | 5/1995 |

* cited by examiner

Primary Examiner—Hoai Ho
(74) Attorney, Agent, or Firm—Miles & Stockbridge P.C.

(57) ABSTRACT

In a nonvolatile memory in which a load on a boosting circuit changes according to the number of rewrite bytes, the boosting circuit is configured so as to perform voltage boosting at a relatively slow predetermined speed regardless of the number of rewrite bytes, whereby stress applied to each storage element is reduced and rewrite resistance is enhanced.

17 Claims, 12 Drawing Sheets

FIG. 2
(A)
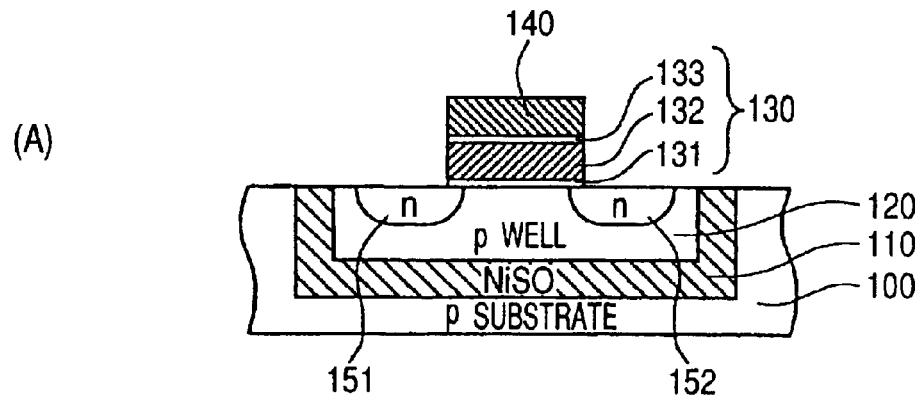
(B)
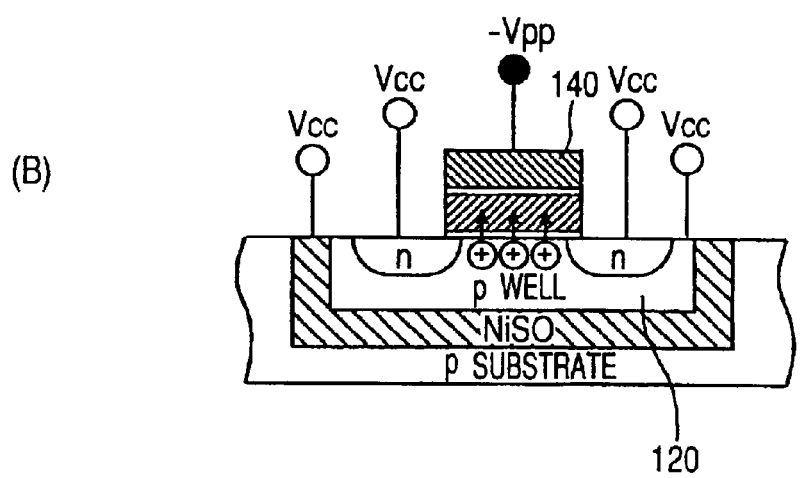
(C)
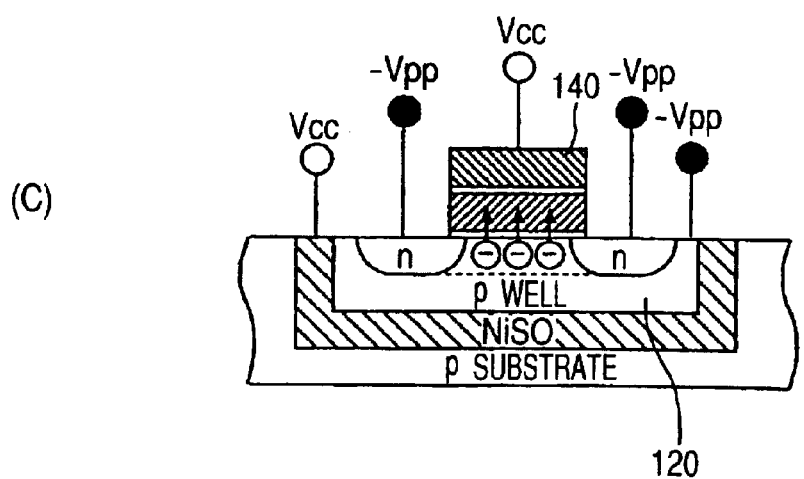

FIG. 4
(A) GATE
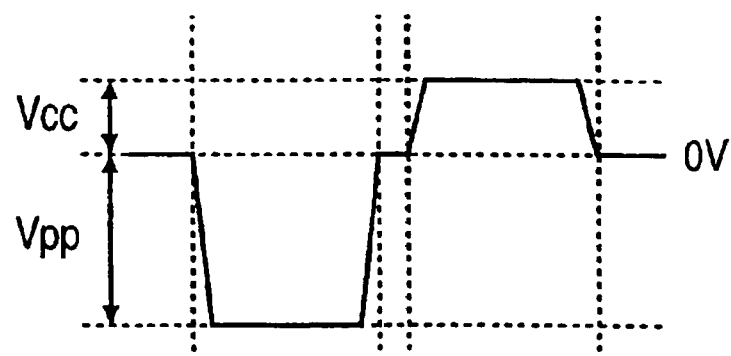
(B) WELL
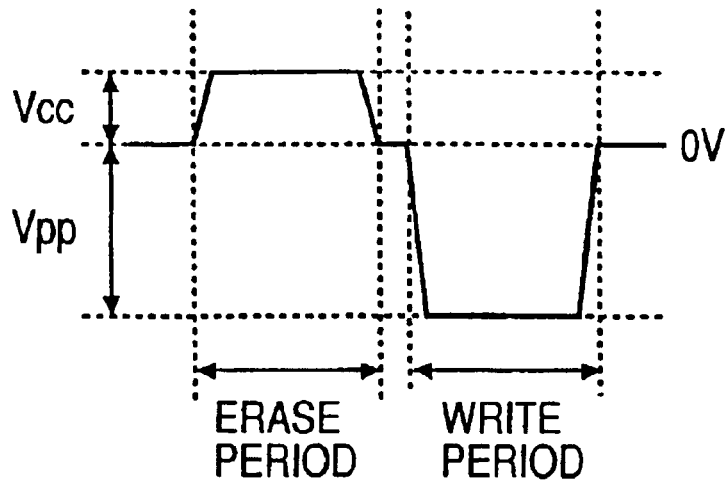

NONVOLATILE MEMORY WITH CONTROLLED VOLTAGE BOOSTING SPEED

TECHNICAL FIELD

The present invention relates to a writing/erasing system suitable for use in a nonvolatile semiconductor memory device, and relates to, for example, a technology suitable for application to a nonvolatile memory device like an electrically erasable programmable read-only memory and an LSI (Large Scale Integration) like a microcomputer with the nonvolatile memory device built therein.

BACKGROUND ART

As storage elements constituting a nonvolatile semiconductor memory device (hereinafter called a "nonvolatile memory"), may be mentioned, for example, so-called MOSFETs each having a two-layer gate structure, each of which includes a floating gate formed over a channel forming region lying between drain/source regions with a gate insulating film interposed therebetween, and a control gate formed over the floating gate with an intergate insulating film interposed therebetween and stores information depending on whether electrons are accumulated in the floating gate. There are also known nonvolatile storage elements each comprising a so-called MOSFET having a MONOS structure, which has a gate electrode formed over a channel forming region with a three-layered gate insulating film made up of an oxide film, a nitride film and an oxide film being interposed therebetween and accumulates electrons or positive holes in the nitride film to thereby store information.

These nonvolatile storage elements need only a relatively low voltage for the purpose of information reading, whereas they need such a relatively high voltage as to bring about the injection of hot carriers and the occurrence of a tunnel current at the gate insulating film in order to write information and erase the information. The conventional nonvolatile memory is often configured so as to be capable of operation by a single power supply with the incorporation of a boosting circuit for generating a high voltage used for writing and erasure therein.

Meanwhile, in the nonvolatile memory wherein the MOSFETs each having the MONOS structure, for accumulating the electrons or positive holes in the nitride film to thereby store the information have heretofore been formed as storage elements, a positive voltage (Vcc) is applied to the gate of each storage element upon writing and a negative high voltage (−Vpp) is applied to a well region (back gate) thereof to accumulate electrons in the nitride film, whereas upon erasure, the negative high voltage (−Vpp) is applied to the gate and the positive voltage (Vcc) is applied to the well region to accumulate positive holes in the nitride film, thereby changing the threshold value of each storage element. Let's now pay attention to one storage element. A well region includes source and drain regions and a channel forming region and is relatively large in size, whereas a gate electrode has a size approximately equal to the channel forming region. Therefore, the erasure at which a boosted high voltage is applied to a gate electrode, i.e., a word line low in parasitic capacitance as compared with the well region, brings about a decrease in load on a boosting circuit. Thus, a voltage boosting speed at erasure rather than at writing becomes fast. Since, however, stress applied to the storage element increases as the voltage boosting speed becomes fast, a defective condition or problem arises in that the maximum number of rewritings (hereinafter called "rewrite resistance") is limited.

The negative high voltage (−Vpp) identical to the gate electrode is applied to a well region of each non-selected or erase-free storage element upon erasure to prevent positive holes from being accumulated in a nitride film. In such a case, a problem arises in that the magnitude of a load on the boosting circuit changes according to the number of non-selected wells, and the voltage boosting speed becomes slow as the number of the non-selected wells increases, whereas the voltage boosting speed becomes fast as the number of the non-selected wells decreases, whereby rewrite resistance of the memory varies according to each system.

Namely, a memory rewritable in byte units shares the use of a well in byte units. Therefore, the number of the non-selected wells varies according to the rewrite mode, i.e., rewriting for each byte or rewriting in page units in such a memory as to be capable of being subjected to rewriting in a unit like, for example, 64 bytes that belong to the same word line, which is called a "page mode" in addition to the rewriting in the byte units. Therefore, a problem arises in that a system wherein access to the memory in the page mode in which the number of non-selected wells is small, is often made, becomes fast in terms of an average voltage boosting speed as compared with a system wherein access to the memory in the byte units is often made, so that memory's rewrite resistance is degraded.

However, the design of the conventional nonvolatile memory has placed emphasis on a rewrite time. Such design that even upon rewriting in the byte units in which the number of the non-selected wells increases, the capability of the boosting circuit is enhanced so that the rewriting is completed within a predetermined time to thereby make the voltage boosting speed fast, has been often effected on the nonvolatile memory. Therefore, such a nonvolatile memory as to be capable of performing both simultaneous rewriting (including rewriting in page mode) of plural bytes and rewriting in byte units is accompanied by a problem that rewrite resistance is degraded as the rewriting of the plural bytes increases.

An object of the present invention is to provide a nonvolatile memory high in rewrite resistance and a semiconductor integrated circuit like, for example, a microcomputer with the nonvolatile memory built therein.

Another object of the present invention is to provide a nonvolatile memory capable of avoiding a great variation in rewrite resistance due to the way of using a system to be utilized, and a semiconductor integrated circuit like, for example, a microcomputer with the nonvolatile memory built therein.

The above, other objects and novel features of the present invention will become apparent from the description of the present specification and the accompanying drawings.

DISCLOSURE OF THE INVENTION

Summaries of typical ones of the inventions disclosed in the present application will be described in brief as follows:

A voltage boosting speed of a boosting circuit is of importance upon writing and erasing in terms of an improvement in rewrite resistance of a nonvolatile memory. As the voltage boosting speed becomes slow, stress applied to each storage element is reduced and hence the rewrite resistance is enhanced. As the voltage boosting speed becomes fast, stress applied to each storage element increases and hence the rewrite resistance is degraded. It is therefore desirable that the voltage boosting speed is slow and the voltage boosting speed is constant regardless of the number of rewrite bytes. While the rewrite resistance is enhanced as the voltage boosting speed becomes slow, a time interval required for rewriting becomes long as the voltage booting speed becomes excessively slow. Therefore, the balance between the two is also of importance.

The present invention provides a nonvolatile memory in which a load on a boosting circuit changes according to the number of rewrite bytes. In the nonvolatile memory, the boosting circuit is configured so as to perform boosting at a predetermined relatively slow speed regardless of the number of rewrite bytes. More specifically, there is provided a nonvolatile memory, comprising a power terminal, a ground terminal, a plurality of nonvolatile storage elements, a control circuit, a boosting circuit for boosting a power supply voltage supplied to the power terminal, wherein a high voltage generated by the boosting circuit is applied to each of back gates of the nonvolatile storage elements to thereby perform writing or erasing, and the magnitude of a load on the boosting circuit varies upon writing and erasing of each memory cell, and wherein the boosting circuit is configured so that a voltage boosting speed at writing and a voltage boosting speed at erasure become approximately equal to each other. Thus, since stress applied to each storage element is reduced upon writing and erasing, rewrite resistance of the nonvolatile memory can be enhanced.

There is also provided a nonvolatile memory comprising a power terminal, a ground terminal, a plurality of nonvolatile storage elements, a control circuit, and a boosting circuit for boosting a power supply voltage supplied to the power terminal, wherein a high voltage generated by the boosting circuit is applied to each of back gates of the nonvolatile storage elements to thereby perform writing or erasing, and a load on the boosting circuit changes according to the number of data upon writing and erasing of each memory cell, and wherein the boosting circuit is configured so that a voltage boosting speed becomes constant regardless of the number of data at writing or erasure. It is thus possible to avoid that stresses applied to the storage elements are different according to the number of data upon writing and erasing, whereby rewrite resistance of the nonvolatile memory can be enhanced.

Further, the present invention is constructed so that a voltage boosting speed can be rendered high according to user's demands, i.e., when a user gives a high priority to a data guarantee or assuring time rather than the rewrite resistance, whereas when the user gives a high priority to the rewrite resistance rather than the data assuring time, the voltage boosting speed can be reduced. More specifically, there are provided a clock generator which generates a boosting clock signal for operating the boosting circuit, and a setting circuit for setting the frequency of the boosting clock signal generated by the clock generator. The clock generator is configured so as to generate a boosting clock signal having a frequency corresponding to a value set to the setting circuit. As the voltage boosting speed becomes slow, the stress applied to each storage element becomes small and hence the rewrite resistance is enhanced. However, a rewrite time interval is generally determined so as to take a predetermined value for each product according to specs in most cases. In such a case, the time required to apply a high voltage becomes short as the voltage boosting speed is made excessively slow. A data assuring time required to assure how long a change in data does not occur even if it is left behind as it is after the rewriting of data, becomes short. However, a user is able to select whether either the rewrite resistance or the data assuring time should be assigned a high priority according to the setting of the voltage boosting speed by the setting circuit.

There are further provided a clock generator which generates an internal clock signal for operating the control circuit, and a second setting circuit for setting the frequency of the internal clock signal generated by the clock generator. The clock generator is configured so as to generate an internal clock signal having a frequency corresponding to a value set to the second setting circuit. Thus, a nonvolatile memory having high general purpose can be provided in which when the user gives a high priority to a rewrite speed rather than rewrite resistance, a voltage boosting speed can be rendered high, whereas when the user gives a high priority to the rewrite resistance rather than the rewrite speed, the voltage boosting speed can be rendered low, and which has characteristics corresponding to user's demands.

BRIEF DESCRIPTION OF THE DRAWINGS

FIG. 2 is a cross-sectional view illustrating a structure of a memory cell which constitutes a memory array of the EEPROM according to the embodiment;

FIG. 4 is a waveform diagram showing the waveforms of voltages applied to a gate (word line) and a well at rewriting of the EEPROM according to the embodiment;

BEST MODE FOR CARRYING OUT THE INVENTION

Figure 1:
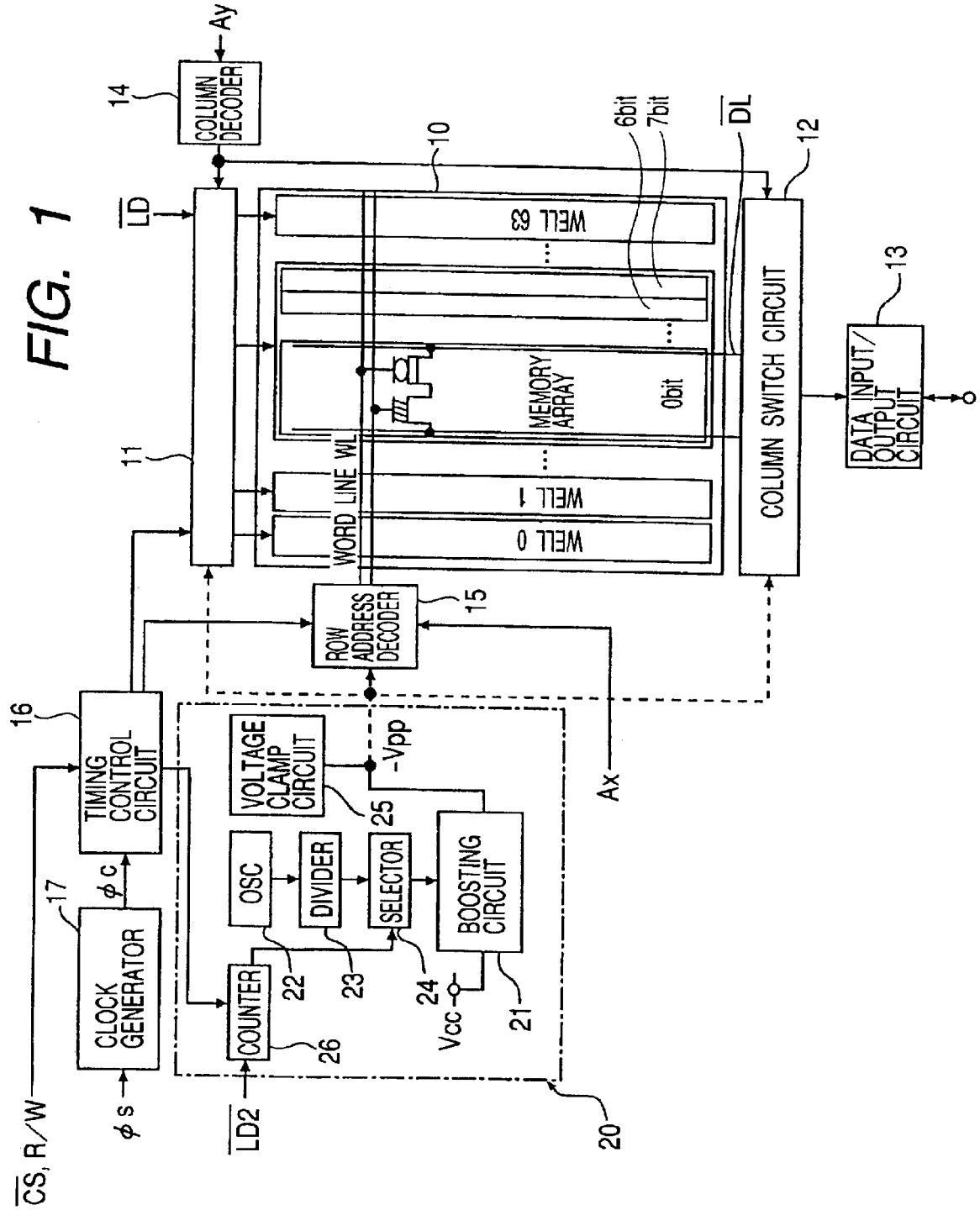
FIG. 1 is a block diagram showing an embodiment of an EEPROM illustrated as an example of a nonvolatile memory to which the present invention is applied.

A block diagram of an embodiment of an EEPROM illustrated as one example of a nonvolatile memory to which the present invention is applied, is shown in FIG. 1. Although not restricted in particular, storage elements constituting the EEPROM according to the embodiment are respectively made up of so-called MOSFETs each having a MONOS structure, which respectively have gate electrodes formed over a channel forming region with a gate insulating film of three layers made up of an oxide film, a nitride film and an oxide film being interposed therebetween, and which respectively store information by accumulating electrons or positive holes in the nitride film. A memory array wherein such storage elements are disposed in a matrix form, memory peripheral circuits for effecting select, write and read operations on the memory array, a boosting circuit for generating high voltages necessary for writing and erasure, etc. are formed on one semiconductor chip like monocrystalline silicon.

In FIG. 1, reference numeral 10 indicates a memory array wherein word lines WL and data lines DL are respectively disposed in directions in which they intersect one another, and memory cells including nonvolatile storage elements are respectively disposed at points where the word lines WL and the data lines DL intersect. In the memory array 10 employed in the present embodiment., although not restricted in particular, control gates of 512, i.e., 64-byte memory cells are connected to one word line WL. The memory cells lying in the same rows are respectively formed on the same well regions WELL0 through WELL63 eight by eight, i.e., in byte units. The memory cells of the same columns, which are connected to the same data lines DL, are respectively formed on the same well regions WELL0 through WELL63. Further, high-voltage word lines HWL for applying write and erase voltages to their corresponding storage elements of the respective memory cells are respectively arranged within the memory array 10 so as to be parallel with the respective world lines WL, whereas common source lines SL are respectively arranged therewithin so as to be parallel with the data lines DL.

Figure 3:
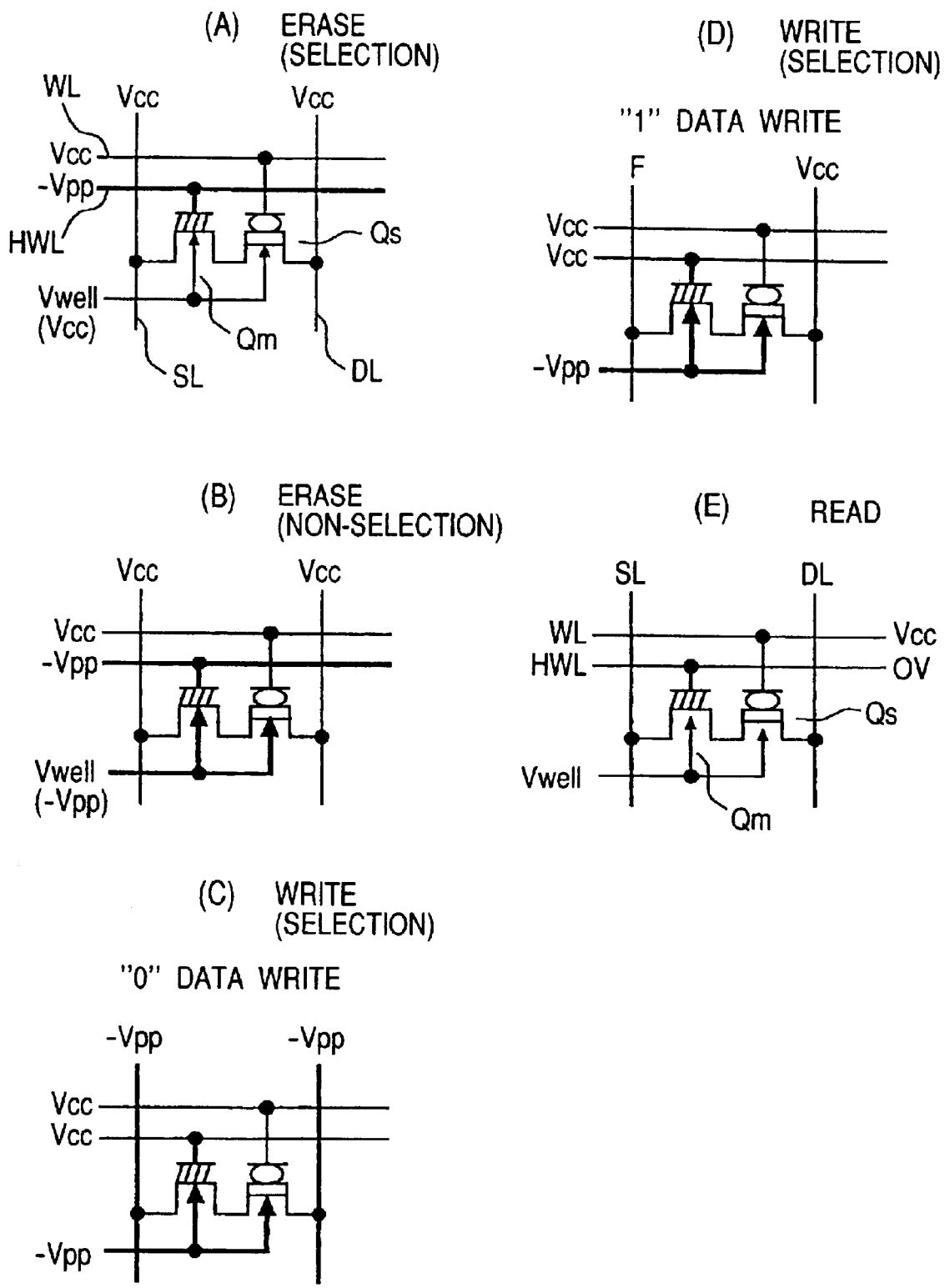
FIG. 3 is a diagram for describing a circuit configuration of the memory cell employed in the EEPROM according to the embodiment and voltages applied to a word line, a high-voltage word line, a data line and a source line at erasure, writing and reading.

More specifically, each of the memory cells constituting the memory array 10 comprises a MONOS-MOSFET Qm used as a nonvolatile storage element, and a select switch MOSFET Qs to which the MOSFET Qm and its corresponding channel are connected so as to be placed in series, as shown even in FIG. 3. Of the two, the gate and drain (source) of the select switch MOSSFET Qs are respectively connected to the word line WL and the data line DL, whereas the gate and source (drain) of the MONOS-MOSFET Qm are respectively connected to the high-voltage word line HWL and the common source line SL. Vwell indicates a well potential applied to base bodies (back gates) of the MOSFETs Qm and Qs.

In FIG. 1, reference numeral 11 indicates a well potential control circuit for applying write and erase-block voltages to the respective well regions WELL0 through WELL63 of the memory array 10, reference numeral 12 indicates a column switch circuit which is connected to the respective data lines DL of the memory array 10 and amplifies a potential read onto the corresponding data line from a selected memory cell, latches read data and holds write data placed or loaded onto the corresponding data line DL upon writing, reference numeral 13 indicates a data input/output circuit which outputs read data to the outside of the chip, and takes in or captures write data inputted from the outside of the chip and transfers it to its corresponding data latch, and reference numeral 14 indicates a column decoder which decodes a column address Ay inputted from the outside to select the corresponding well to which a voltage is applied by the well potential control circuit 11 and select data latched in the column latch circuit 12 in byte units, respectively.

The column decoder 14 transfers data of bytes corresponding to an address signal to the column latch circuit 12 between the corresponding data line DL and the data input/output circuit 13 in read and write modes set in byte units. In a page mode, the column decoder 14 sequentially captures or takes in 64-byte data in byte units from the data input/output circuit 13 while updating an internal address counter, for example, and outputs the same to the data input/output circuit 13.

Further, reference numeral 15 indicates a row address decoder which decodes a row address signal Ax inputted from outside to thereby select one word line WL lying within the memory array 11 and selectively apply an erase voltage to the corresponding high-voltage word line HWL. Reference numeral 16 indicates a timing control circuit which determines operation modes, based on the chip select signal /CS indicative of a chip selected state, a read/write signal R/W for designating a data write or read operation, etc. which are inputted from outside to thereby generate internal timing control signals corresponding to the respective modes.

The EEPROM according to the present embodiment is provided with a clock generator 17 for generating an internal clock signal φc necessary for the timing control circuit 16 based on a reference clock signal φs inputted from outside, a high-voltage power supply circuit 20 for generating a high voltage −Vpp required upon writing and erasing, etc. The high voltage −Vpp generated by the high-voltage power supply circuit 20 is supplied to the well potential control circuit 11, the column latch circuit 12 and the row address decoder 15 with predetermined timings corresponding to the respective operation modes.

The high-voltage power supply circuit 20 comprises a boosting circuit 21 comprising a charge pump or the like which steps up or boosts a power supply voltage Vcc like 5.5V, 3.3V or 1.8V supplied from outside to generate a high voltage −Vpp like −7V, −10V or −11V, an oscillator 22 like a ring oscillator which generates a boosting clock necessary for the operation of the boosting circuit 21, a frequency divider 23 which divides the generated boosting clock, a selector 24 which selects a clock having a desired frequency from the divided clocks, a clamp circuit 25 which clamps the boosted voltage to a desired potential, etc. Since the power supply circuit having such a configuration is frequently used even in a flash memory or the like and is already known, its detailed description will be omitted.

Incidentally, the power supply circuit 15 generates power supply voltages excluding Vcc, such as a read voltage, a verify voltage, etc., which are required inside the chip, in addition to the high voltage −Vpp at writing and erasing. The power supply circuit selects a desired voltage from these voltages according to the operating state of the memory and supplies it to the well potential control circuit 11, the column latch circuit 12 and the row address decoder 15 or the like.

Further, the present embodiment is provided with a counter or counter unit 26 for counting a byte signal/LD2 having pulses corresponding to the number of rewrite bytes supplied from an external CPU or the like. The present embodiment is configured in such a manner that the selector 25 is controlled according to the number of bytes counted by the counter 26 to make it possible to control a voltage boosting speed of the boosting circuit 21. Described specifically, the selector 25 is controlled so that when it is desired to slow the voltage boosting speed, the boosting circuit 21 is supplied with a clock having a low frequency, whereas when it is desired to make the voltage boosting speed fast, the boosting circuit 21 is supplied with a clock having a high frequency. The byte signal/LD2 is a signal that one pulse means one byte of rewrite data. When, for example, a byte signal /LD2 corresponding to 8 pulses is continuously supplied, it means that the rewriting of data of 8 bytes has been carried out.

A structure of a nonvolatile storage element comprised of each of MOSFETs having MONOS structures, which constitute the memory array 10, is shown in FIG. 2(A). The MONOS-structured MOSFET comprises a gate electrode 140 made up of polysilicon, which is formed over a semiconductor substrate 100 with a three-layer structured gate insulating film 130 formed of an oxide film 131, a nitride film 132 and an oxide film 133 provided on the surface of a P-type well region 120 surrounded by an N-type isolation region 110 being interposed therebetween, and a source region 151 and a drain region 152 each made up of an n-type diffusion layer, which is formed in the surface of the P-type well region 120 on both sides of the gate insulating film 130.

In the nonvolatile storage element (Qm) comprising the MOSFET having the MONOS structure, a negative high voltage (−Vpp) is applied to the gate electrode 140, a positive voltage (Vcc) is applied to the well region 120, and Vcc is applied to the source and drain thereof upon erasure as shown in FIGS. 2(B) and 3(A), so that positive holes are stored in the nitride film. Incidentally, as shown in FIG. 3(B), the same high voltage (−Vpp) as a high-voltage word line HWL is applied to its corresponding well in each non-selected storage element which shares the use of a word line at this time, so that the injection of positive holes is blocked.

On the other hand, the nonvolatile storage element is controlled in such a manner that upon writing as shown in FIGS. 2(C) and 3(C), a positive voltage (Vcc), a negative high voltage (−Vpp) and −Vpp are respectively applied to the gate electrode 140, the well region 120 and the source and drain to store electrons in the nitride film. Incidentally, "1" of write data and "0" of write data respectively correspond to the erase operation and the write operation upon erasure and writing in the present embodiment. Thus, the storage element (Qm) in which the data is rewritten from "1" to "0", is controlled in such a manner that only the erasure is executed, and a drain (data-line side) potential is set to Vcc and a source potential is brought to floating to thereby avoid the injection of electrons as shown in FIG. 3(D) upon data writing.

FIG. 4 shows a voltage waveform (A) applied to the gate electrode of the storage element (Qm) and a voltage waveform (B) applied to the well upon data rewriting. As is understood from the same drawing, a negative high voltage −Vpp and a positive voltage (Vcc) are first respectively applied to the gate electrode 140 and the well region 120 upon the data rewriting so that a voltage of a writing-depth Vcc+Vpp is applied between the gate and well, whereby positive holes are injected into the gate insulating film. Subsequently, the positive voltage (Vcc) and the negative high voltage −Vpp are respectively applied to the gate electrode 140 and the well region 120 so that the voltage of the writing-depth Vcc+Vpp is applied between the gate and well in the direction opposite to that at erasure, whereby the injection of electrons into the gate insulating film is carried out.

Figure 5:
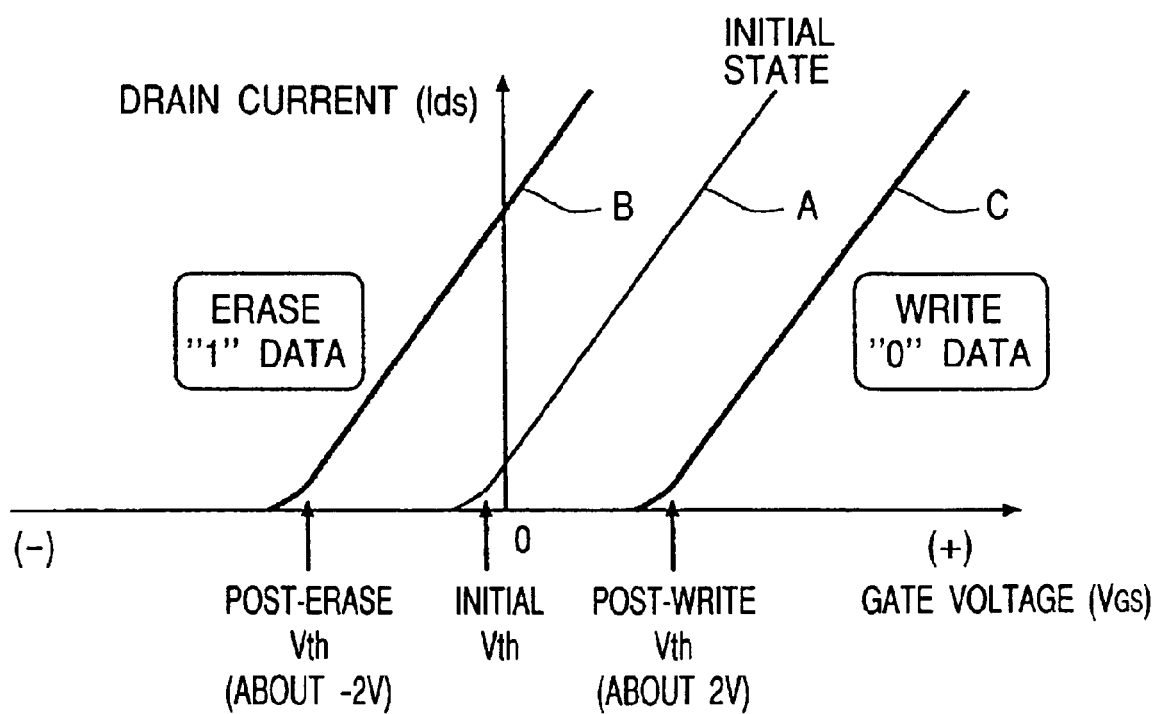
FIG. 5 is a characteristic diagram illustrating respective gate voltage-drain current characteristics of a storage element in its initial state and subsequent to its erasure and writing in the EEPROM according to the embodiment.

Owing to the above-described rewrite operation, a storage element having such a gate voltage-drain current characteristic as indicated by a curve A of FIG. 5 in its initial state changes in characteristic as indicated by a curve B when positive holes are stored in the nitride film due to its erasure, whereby the threshold value of the storage element is brought to a level like about −2V. When the positive holes are accumulated in the nitride film due to writing, the storage element changes in characteristic as indicated by a curve C, whereby the threshold value thereof is brought to a level like 2V. Although not restricted in particular, the storage element set so as to have such a characteristic as indicted by the curve B is brought to an on state since its threshold value is low when selected upon reading. Thus, the precharged data line DL is changed to a low level so that its potential is read as storage or memory data "1". On the other hand, the storage element set so as to have such a characteristic as indicated by the curve C is brought to an off state since the threshold value thereof is high when selected upon reading. Thus, the precharged data line DL remains held at the low level, so that its potential is read as memory data "0".

FIG. 3(E) shows a bias state of the memory cell at reading. As shown in the same drawing, the word line WL is set to Vcc after its precharge to Vcc has been made upon reading, so that the select switch MOSFET Qs is brought to an on state. The high-voltage word line HWL is set to a potential like 0V, for example, and hence the MOSFET is brought to an on or off state according to the threshold value (2V or −2V) of the MOSFET Qm of each selected memory cell. When it is turned on, a current flows from the data line DL to the source line SL so that the potential at the data line DL changes to 0V. When it is turned off, a current path extending from the data line DL to the source line SL is cut off or blocked so that the potential at the data line DL remains at Vcc. This potential is amplified by and latched in the column latch circuit 12 connected to its corresponding data line. In the present embodiment, the logic of the latched data is inverted and outputted.

Figure 6:
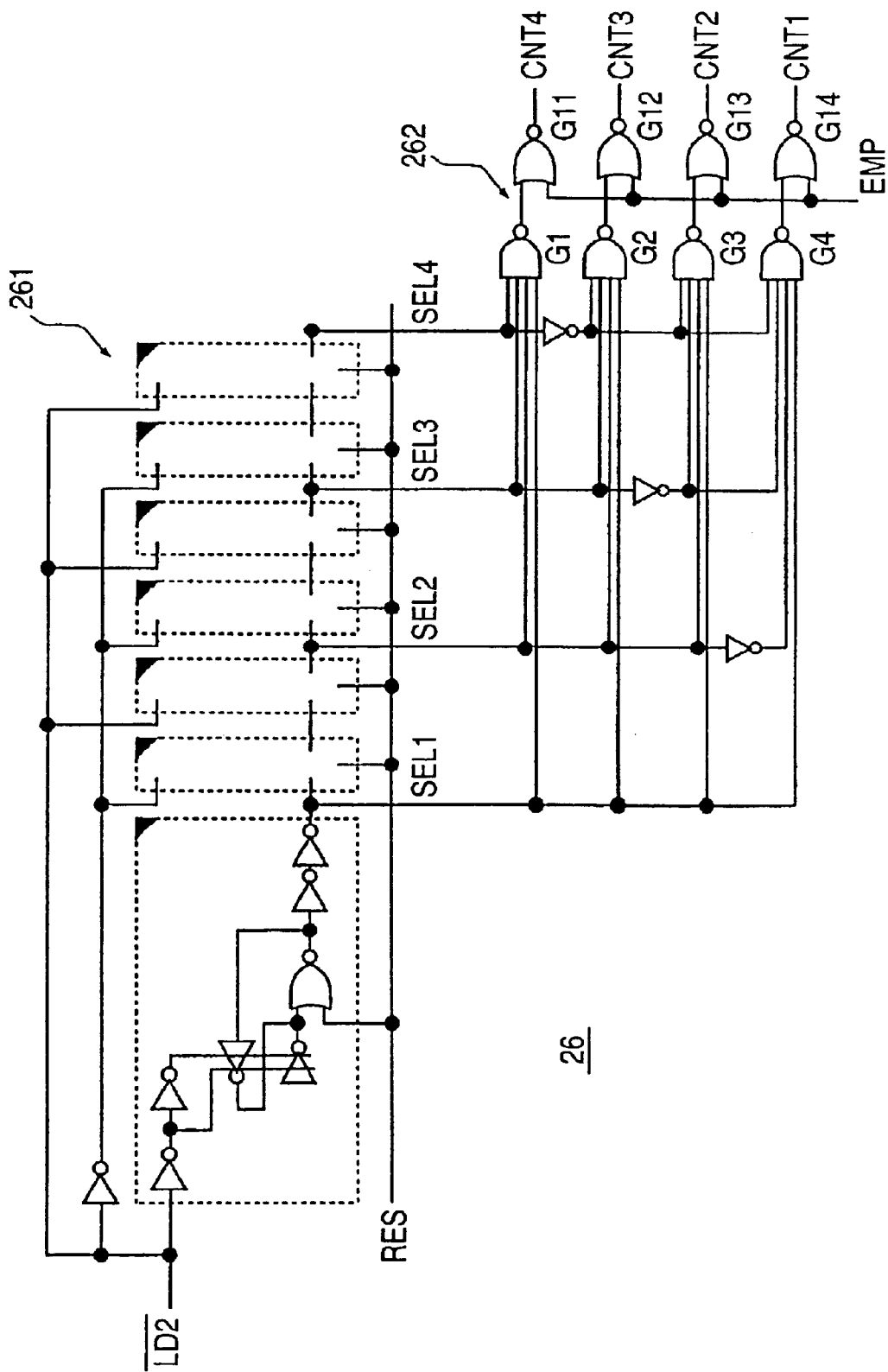
FIG. 6 is a circuit configurational diagram showing a configurational example of a counter for counting the number of rewrite bytes in the EEPROM according to the embodiment.

A configurational example of the counter 26 shown in FIG. 1 is illustrated in FIG. 6. As shown in FIG. 6, the counter 26 includes a counter 261 capable of performing count-up to "64" in synchronism with the rising edge or falling edge of the byte signal /LD2, and an output control signal generation unit 262. As shown in Table 1, the counter 261 of the two is configured in such a manner that an output signal SEL1 is changed to a high level "1" when pulses of the byte signal /LD2 range from 1 to 16, an output signal SEL2 is changed to a high level when the pulses thereof range from 17 to 32, an output signal SEL3 is changed to a high level when the pulses thereof range from 33 to 48, and an output signal SEL4 is changed to a high level when the pulses thereof range from 49 to 64, sequentially respectively.

TABLE 1

| Number of selected bytes | SEL1 | SEL2 | SEL3 | SEL4 | CNT1 | CNT2 | CNT3 | CNT4 | Supply clock |
|---|---|---|---|---|---|---|---|---|---|
| 1 to 16 | 1 | 1 | 1 | 1 | 1 | 0 | 0 | 0 | OSC1 |
| 17 to 32 | 0 | 1 | 1 | 1 | 0 | 1 | 0 | 0 | OSC2 |
| 33 to 48 | 0 | 0 | 1 | 1 | 0 | 0 | 1 | 0 | OSC3 |
| 49 to 64 | 0 | 0 | 0 | 1 | 0 | 0 | 0 | 1 | OSC4 |

The output control signal generation unit 262 comprises NAND gates G1 through G4 which respectively receive, as inputs, output signals SEL1 and SEL2 through SEL4 of the counter 261 and/or signals /SEL2 through /SEL4 obtained by inverting them by their corresponding inverters, and NOR gates G1 through G14 which receive, as inputs, respective signals outputted from these NAND gates G1 through G4 and a common enable signal EWP. The output control signal generation unit 262 is configured such that as shown in Table 1, only an output signal CNT1 is changed to a high level when the pulses of the byte signal /LD2 range from 1 to 16, only an output signal CNT2 is changed to a high level when the pulses ranges from 17 to 32, only an output signal CNT3 is changed to a high level when the pulses ranges from 33 to 48, and only an output signal CNT4 is changed to a high level when the pulses ranges from 49 to 64. The output signals CNT1 through CNT4 are supplied to the selector 24 for selecting the clocks divided by the divider 23, as select control signals.

Figure 7:
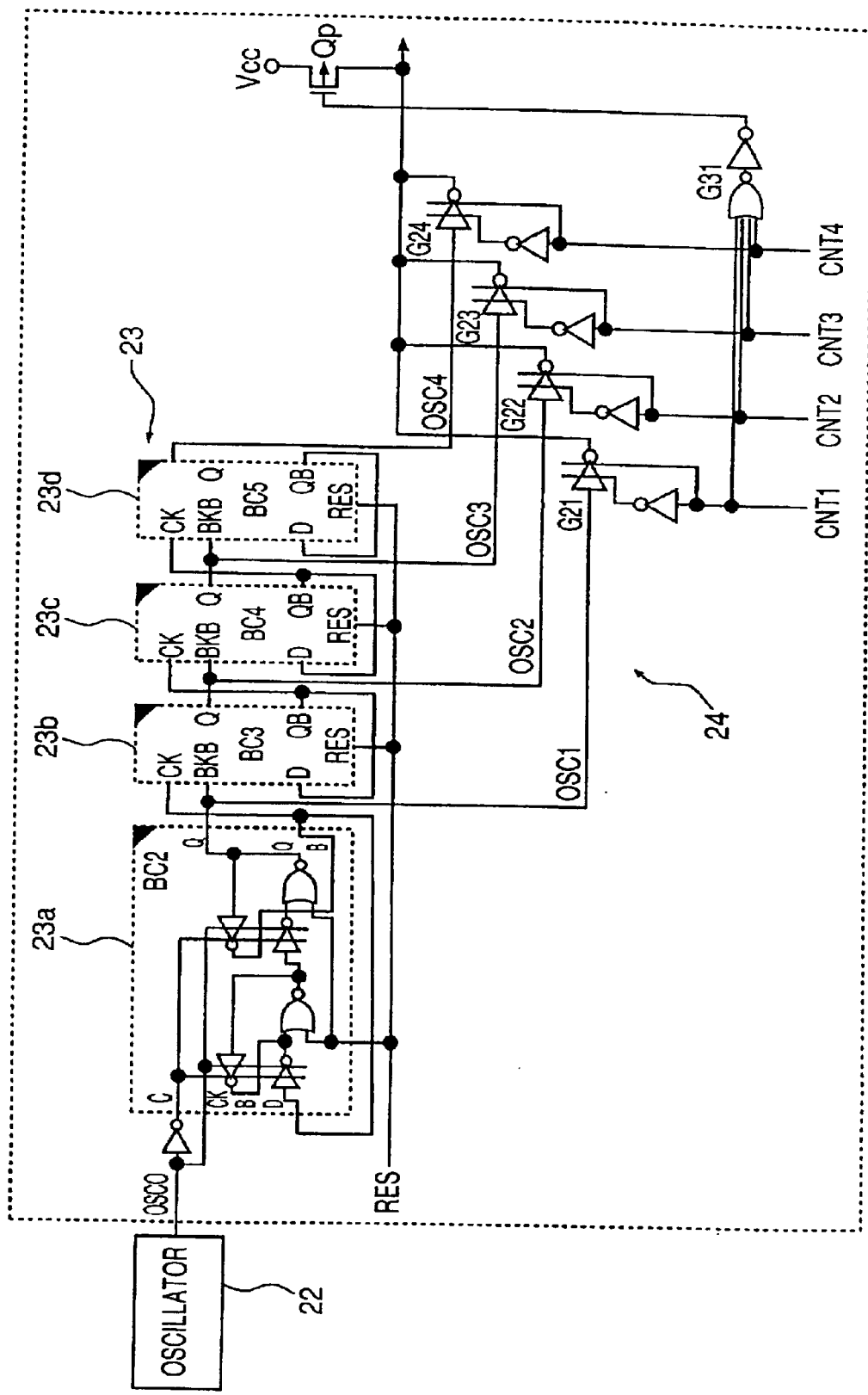
FIG. 7 is a circuit configurational diagram illustrating a configurational example of a selector for selecting a boosting clock to be supplied to a charge pump employed in the EEPROM according to the embodiment.

A configurational example of the selector 24 is shown in FIG. 7. The selector 24 comprises transmission gates G21 through G24 like clocked inverters, which receive clocks OSC1, OSC2, OSC3 and OSC4 different in frequency outputted from respective dividing stages of the divider 23, as inputs respectively, and receive the signals CNT1 through CNT4 supplied from the output control signal generation unit 262 therein as control signals, a NOR gate G31 which ANDs the signals CNT1 through CNT4, and a pull-up MOSFET Qp on/off-controlled by a signal outputted from the NOR gate G31.

When such signals CNT1 through CNT4 as shown in Table 1 are respectively supplied to the transmission gates G21 through G24 from the output control signal generation unit 262, any of them is brought into a conducting state, so that the corresponding transmission gate supplies any of the clocks OSC1, OSC2, OSC3 and OSC4 supplied from the divider 23 to the boosting circuit 21 corresponding to a subsequent stage. Described specifically, when the number of rewrite bytes corresponds to 1 to 16, the clock OSC1 high in frequency is supplied to the boosting circuit 21, when the number thereof corresponds to 17 to 32, the clock OSC2 slightly low in frequency is supplied thereto, when the number thereof corresponds to 33 to 48, the clock OSC3 lower in frequency is supplied thereto, and when the number thereof corresponds to 49 to 64, the clock OSC4 lowest in frequency is supplied thereto, respectively. On the other hand, when the signals CNT1 through CNT4 are all "0", the transmission gates G21 through G24 are all cut off and the output of the NOR gate G31 is brought to a low level, so that the pull-up MOSFET Qp is turned on, thus making it possible to avoid the supply of the clocks sent from the divider 23 to the boosting circuit 21 and prevent the voltage supplied to the boosting circuit 21 from being rendered unstable. Consequently, the boosting circuit 21 stops a boosting operation while a rewrite operation or the like is not being performed.

Figure 8:
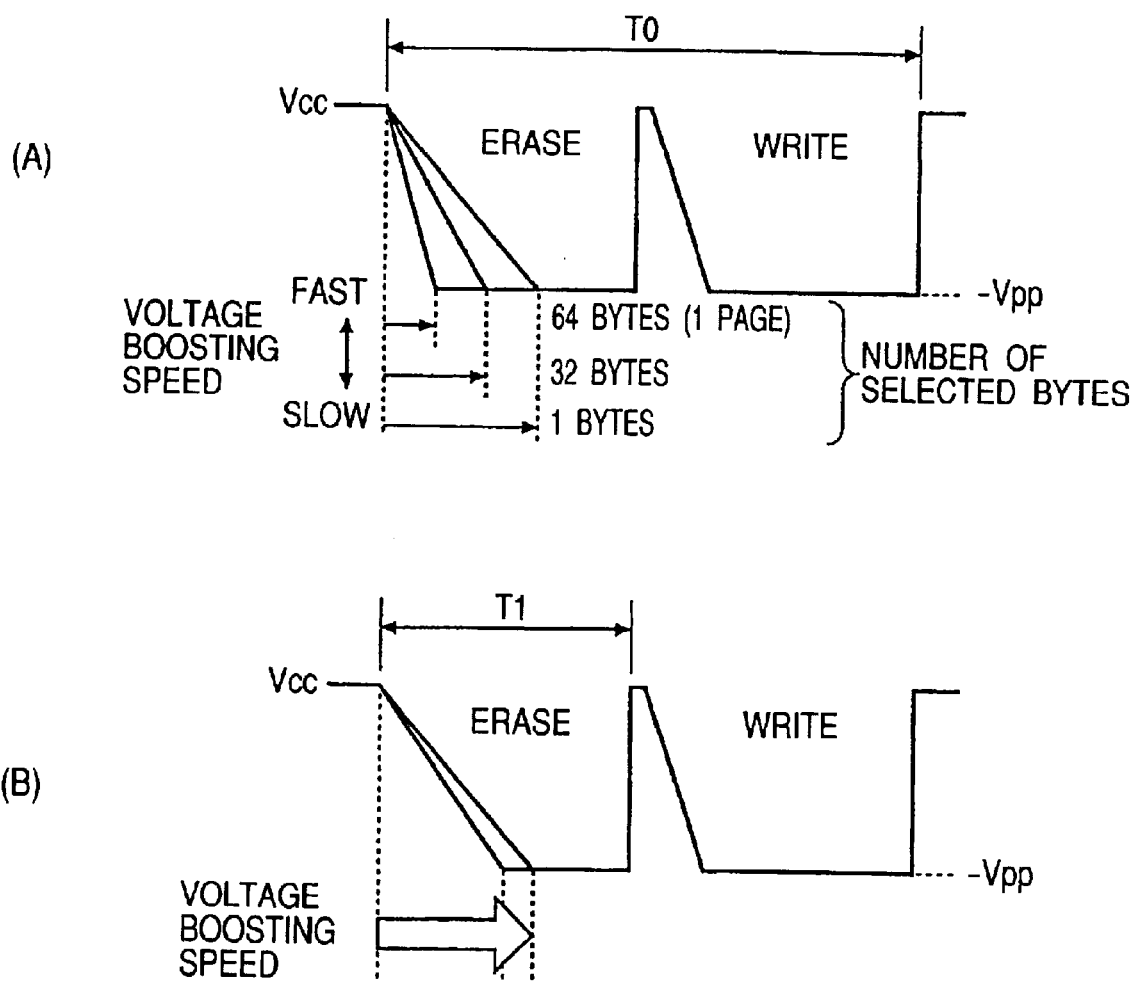
FIG. 8 is an explanatory diagram depicting a voltage boosting speed according to the conventional EEPROM and a voltage boosting speed according to the EEPROM of the present invention.

Since the high voltage −Vpp is applied to each non-selected well related to the same word line upon erasure in the EEPROM having such a configuration as shown in FIG. 1 with the MONOS-MOSFETs each having the structure of FIG. 2 as the storage elements, the number of the non-selected wells changes depending on the number of rewrite bytes and thereby the magnitude of a load on the boosting circuit changes. Therefore, if some measures against it are not taken, then the larger the number of the non-selected wells, the slower the voltage boosting speed, and the fewer the number of the non-selected wells, the faster the voltage boosting speed. Further, the voltage boosting speed changes greatly as shown in FIG. 8(A) upon erasure. However, since the frequency of the corresponding clock supplied to the boosting circuit 21 is changed according to the above-described number of rewrite bytes in the present embodiment, a variation width of the voltage boosting speed is reduced as shown in FIG. 8(B).

As a result, the occurrence of variations in rewrite resistance can be avoided where rewriting in the byte units increases and rewriting in the page mode increases. Since, however, the control for changing the voltage boosting speed according to the number of the rewrite bytes is made for the match to the slow voltage boosting speed in the present embodiment, stress given to each storage element upon erasure is reduced and rewrite resistance is greatly improved as compared with the case in which the control is taken for the match to the fast voltage boosting speed.

Incidentally, while the present embodiment has described the case in which the rewriting of data of 1 to 64 bytes is performed in parts in the form of four stages and the frequency of each clock is varied according to the number of rewrite bytes, thereby making it possible to control the voltage boosting speed of the boosting circuit 21 in four stages, the present invention is not limited to it. From relations such as a circuit scale, etc., the voltage boosting speed can be divided into arbitrary stages such as eight stages, sixteen stages, etc.

Another embodiment of the present invention will next be explained using FIG. 9. Incidentally, circuit blocks in FIG. 9, which are identical to those shown in FIG. 1, are respectively identified by the same reference numerals and the description of common ones will therefore be omitted.

As described above, the stress given to the storage element is reduced and the rewrite resistance is improved as the voltage boosting speed at the erasure is rendered slow. However, a rewrite time (T0 in FIG. 8) is generally often fixed to a constant value for each product according to specs. In such a case, a high-voltage application time (T1 in FIG. 8) becomes short when the voltage boosting speed is made extremely slow, and a data guarantee or assuring time required to assure how long a change in data does not occur even if it is left behind as it is after the rewriting of the data, becomes short. However, users who place importance on the rewrite resistance rather than the data assuring time, and users who attach importance to the data assuring time rather than the rewrite resistance, exist in fact.

Figure 9:
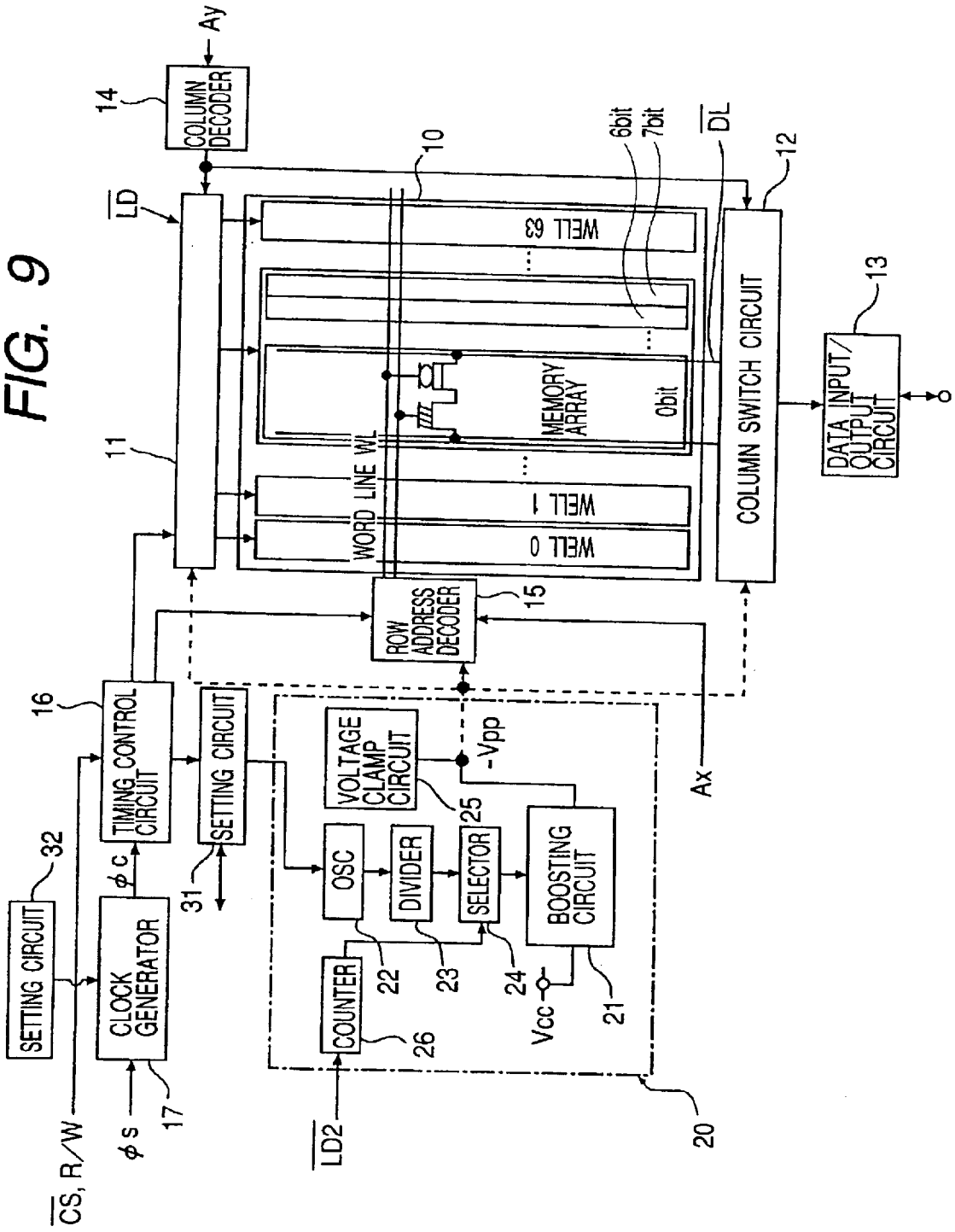
FIG. 9 is a block diagram showing a second embodiment of an EEPROM illustrated as one example of a nonvolatile memory to which the present invention is applied.

Therefore, the embodiment of FIG. 9 is configured so as to be capable of adjusting an oscillation frequency of an oscillator 22 for generating a boosting clock signal and is provided with a setting circuit 31 like a register for setting to which extent the oscillation frequency should be taken. Changing a value set to the setting circuit 31 enables a change in voltage boosting speed. Consequently, whether the rewrite resistance should be assigned high priority or the data assuring time should be assigned high priority, can be set after the manufacture of a memory chip or after the corresponding memory has been built in a system.

Figure 10:
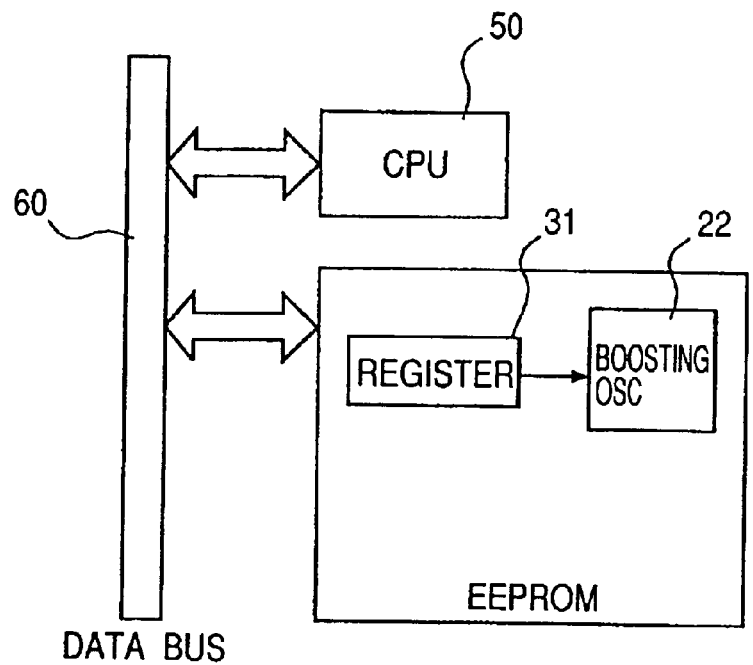
FIG. 10 is a block diagram illustrating one example of a system for performing setting on a setting circuit (register) employed in the EEPROM according to the second embodiment.

Incidentally, the setting circuit 31 is not limited to the register. It is however desirable that when the setting circuit 31 is made up of the register, the setting circuit 31 is configured so that the value of the register 31 can be set by an external CPU 50 through a bus 60 as shown in FIG. 10. As an alternative to the register, a setting circuit having a programmable element such as a fuse, a nonvolatile memory may be configured so as to be capable of changing the oscillation frequency of the oscillator 22 after chip production. In such a case, information on the frequency may be set by a dedicated test or a write device, or the CPU 50 may set the frequency information by obtaining access to the nonvolatile memory.

Further, the embodiment shown in FIG. 9 is provided with a second setting circuit 32 made up of a register or the like similarly in association with a clock generator 17 for generating an internal operation clock $\phi c$. When the set value of the setting circuit 32 is changed, the frequency of the internal clock $\phi c$ changes and hence a cycle time is changed so that a rewrite time T0 per se varies.

Figure 11:
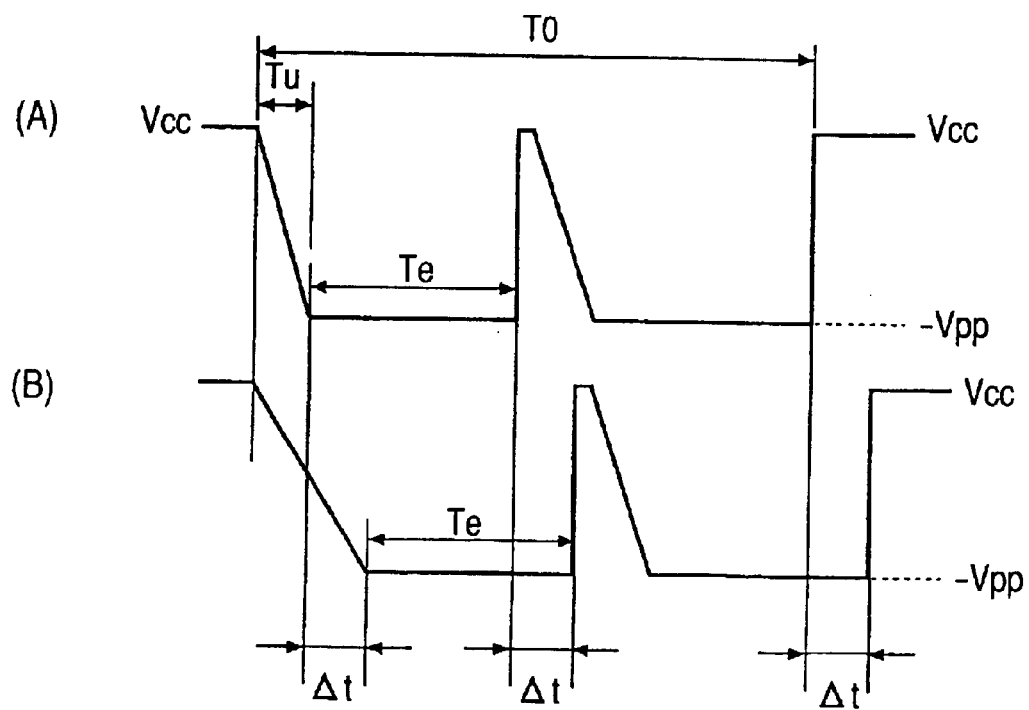
FIG. 11 is an explanatory diagram showing the relationship between a voltage boosting speed and a cycle time employed in an EEPROM according to another embodiment of the present invention.

As described above, as the voltage boosting speed at erasure becomes slow, stress given to each storage element is reduced and hence the rewrite resistance is improved. As, however, the voltage boosting speed is made extremely slow, the high-voltage application time (T1 in FIG. 8) becomes short and hence the data assuring time is shortened. If, however, the cycle time T0 becomes long, then a boosting time Tu is made long by $\Delta t$ as shown in FIG. 11(B), and even if the boosting time Tu is increased in this way, the cycle time T0 is also made long by $\Delta t$ in accordance with the increase in the boosting time, whereby an erase voltage application time Te identical to one antecedent to the increase in T0 is ensured. Therefore, the rewrite resistance is improved and the data assuring time can also be made long.

Incidentally, while the embodiment of FIG. 9 has showed the example in which the setting circuit 31 for changing the oscillation frequency of each boosting clock and the setting circuit 32 for changing the oscillation frequency of the internal operation clock $\phi c$ are provided in several, only the setting circuit 31 for changing the oscillation frequency of the boosting clock may be provided or the setting circuit may be shared. The sharing of the setting circuit herein means that when the oscillation frequency of the boosting clock is changed, the oscillation frequency of the internal operation clock $\phi c$ is also changed in cooperation with it.

While the cycle time of the memory exerts a direct influence on an access speed and is of an important factor in terms of a memory's characteristic, there may be also cases where the rewrite resistance and data assuring time rather than the access speed are of importance depending on systems, and the access speed is important. According to the present embodiment, when the access speed is of importance with the change in the set value of the setting circuit 32, the clock frequency is set high, whereas when the rewrite resistance and data assuring time are important, the clock frequency is set high, whereby the present embodiment is capable of coping with any request without designing another chip.

Figure 12:
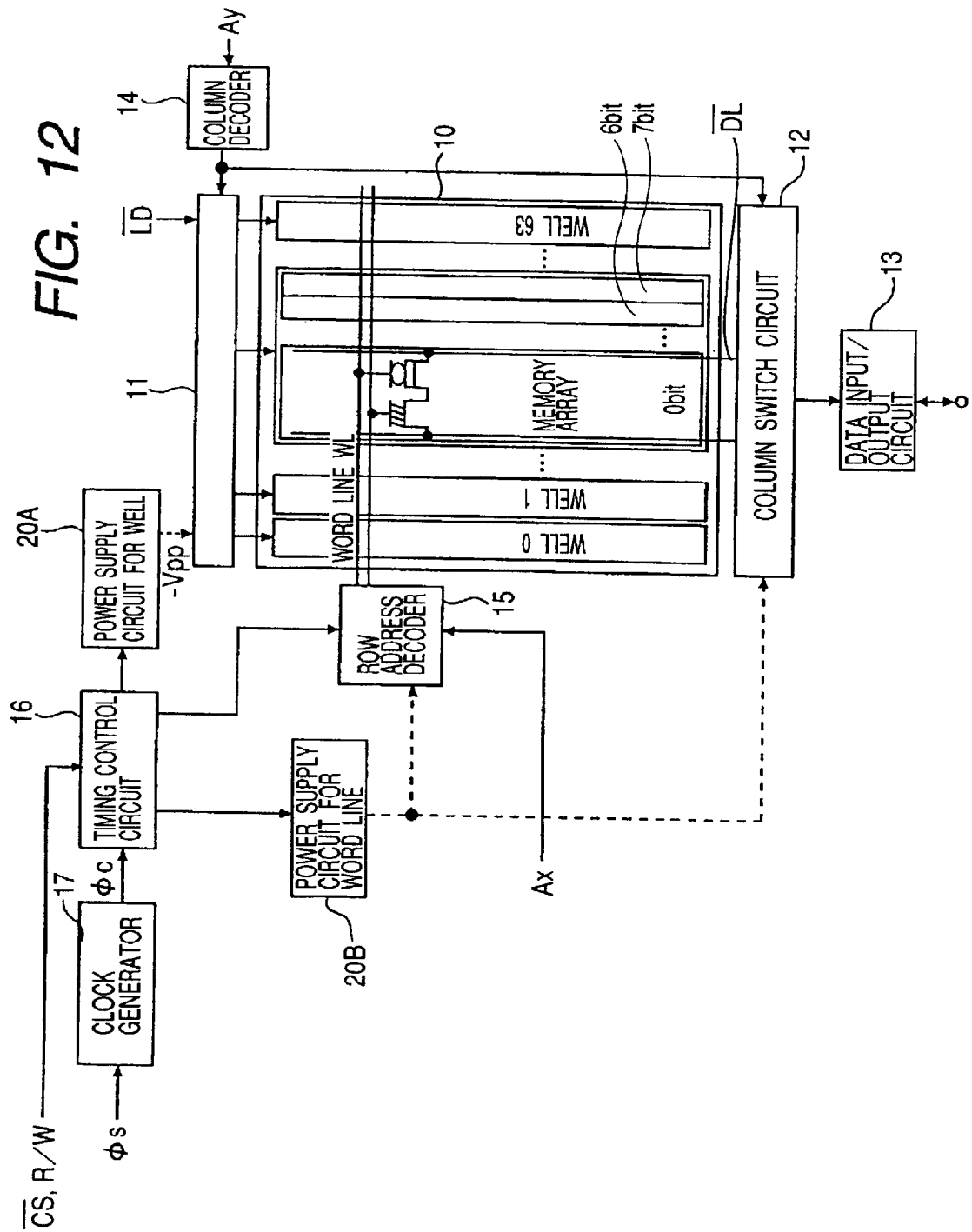
FIG. 12 is a block diagram illustrating a third embodiment of an EEPROM illustrated as one example of a nonvolatile memory to which the present invention is applied.

FIG. 12 shows a further embodiment of the present invention. In the embodiment shown in FIG. 12, a power supply circuit 20A for generating a high voltage $-Vpp$ used for application to each well, and a power supply circuit 20B for generating a high voltage $-Vpp$ for each high-voltage word line are provided in several. Since the present embodiment is identical in other configuration to FIG. 1, the same circuit blocks as those shown in FIG. 1 are respectively identified by the same reference numerals and the description of common ones will therefore be omitted.

In the present embodiment, the power supply circuit 20A for generating the well-applying high voltage $-Vpp$ has a configuration similar to the power supply circuit 20 shown in FIG. 1 or 9. On the other hand, since the power supply circuit 20B for generating the high voltage $-Vpp$ for each high-voltage word line is constant in load regardless of the number of rewrite bytes (only selected high-voltage word line HWL) and needs not to change a voltage boosting speed, the selector 24 and the counter 26 for counting the byte signal /LD2 in the power supply circuit 20 employed in the embodiment of FIG. 1 become unnecessary. In such an embodiment as shown in FIG. 9 in which the power supply circuit 20 is used commonly for each well and high-voltage word line, and the setting circuit 31 for setting the frequency of the boosting clock is provided, the voltage boosting speed at writing is also automatically changed when the setting of the setting circuit 31 is changed to adjust the voltage boosting speed at erasure. In the embodiment of FIG. 12, however, only the voltage boosting speed at erasure can be adjusted independently, and the voltage boosting speed at erasure and the voltage boosting speed at writing can be respectively optimized discretely.

Figure 13:
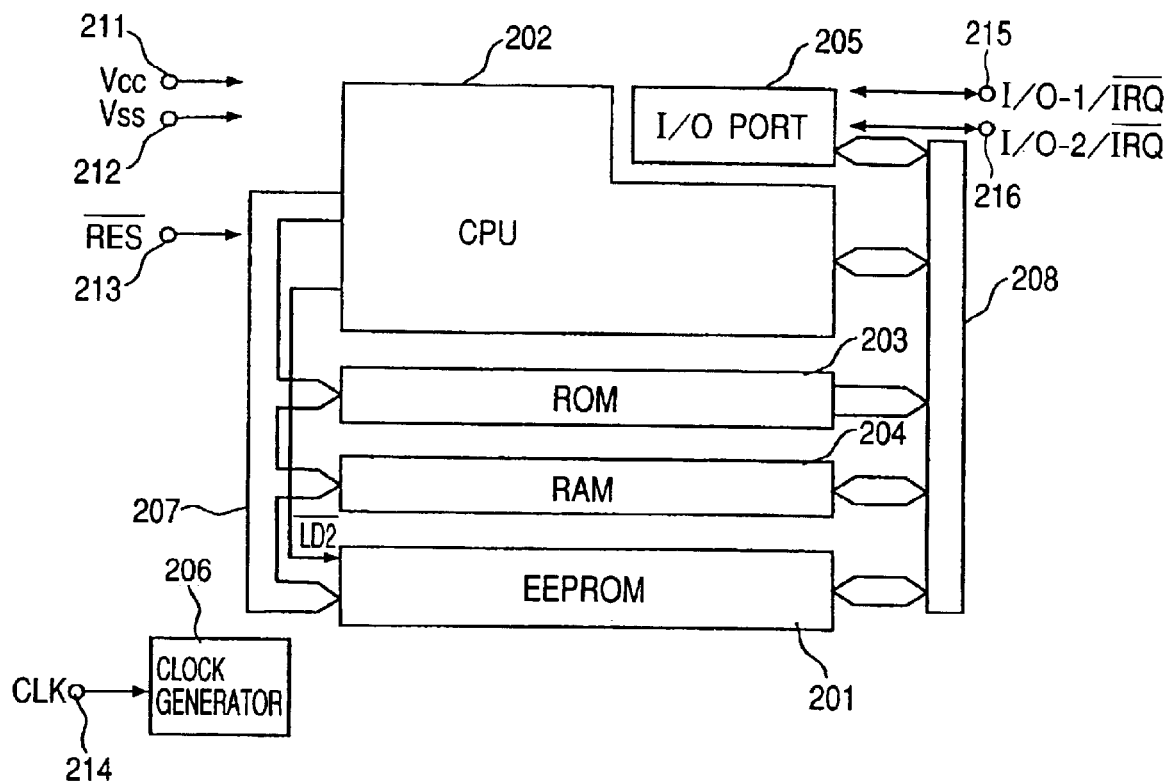
FIG. 13 is a block diagram showing a configurational example of an IC card system illustrated as one example of an application system of an EEPROM to which the present invention is applied.

FIG. 13 shows a configurational example of a system when the EEPROM chip is used as a memory for an IC card. In FIG. 13, reference numeral 201 indicates an EEPROM used as a nonvolatile memory according to the present invention, which has such a configuration as described in the above-described embodiment, reference numeral 202 indicates a CPU (Central Processing Unit) of a program control type or system for controlling the whole system, reference numeral 203 indicates a ROM (Read Only Memory) which has stored therein programs to be executed by the CPU and fixed data necessary for execution of each program, reference numeral 204 indicates a RAM (Random Access Memory) for providing a working area and a temporarily storing area for the CPU 202, reference numeral 205 indicates an input/output port which performs transmission/reception of signals between the system inside the card and a device provided outside the card, and reference numeral 206 indicates a clock generator for waveform-shaping or dividing a clock signal CLK supplied from outside the card to thereby generate a system clock $\phi s$ necessary to operate the EEPROM 201 and the CPU 202.

These circuits are respectively configured as discrete chips or formed on one semiconductor chip. The CPU 202 and the ROM 203, RAM 204, EEPROM 201 and input/output port 205 are interconnected with one another via an address bus 207 and a data bus 208 to thereby enable transmission and reception of data. A signal /LD2 indicative of the number of rewrite bytes referred to above is supplied from the CPU 202 to the EEPROM 201.

In FIG. 13, reference numerals 211 through 216 indicate external terminals, which include power terminals 211 and 212 for accepting the supply of power supply voltages Vcc and Vss, a reset terminal 213 for receiving a reset signal /RES for resetting the system to an initial state, a clock terminal 214 for receiving a clock signal CLK supplied from outside the card, and data input/output terminals 215 and 216 connected to the input/output port 205 so as to perform a serial input/output.

Figure 14:
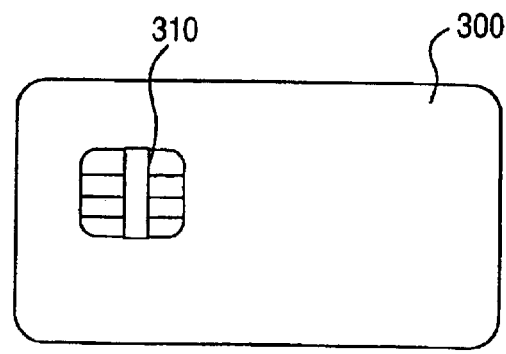
FIG. 14 is a schematic diagram illustrating an outward appearance of an IC card.

FIG. 14 shows an outward appearance of an IC card with the EEPROM built therein. In the drawing, reference numeral 300 indicates a card body formed of plastic or the like, reference numeral 310 indicates an electrode portion used as a external terminal provided on the surface of the card body 300. The external terminals 211 through 216 shown in FIG. 13 are electrically connected to the electrode portion. The respective chips 201 through 206 shown in FIG. 13 are disposed on the underside of the electrode portion 310 in FIG. 14 and accommodated in a package made up of plastic or the like or mounted on a printed wiring board. Being molded with a resin or the like configures their entirety.

The IC card according to the present invention is not limited to such a contact type as shown in FIG. 14. A non-contact type IC card may be adopted. In such a case, the IC card may be one in which the electrode portion 310 used as the external terminal does not appear in external appearance. Further, as information for controlling rewriting so as to make a data assuring time long in the IC card according to the present invention, may be mentioned, money information for a finance-aimed IC card, ID information adopted when it is used as an ID card, an encrypt key/decrypt key used when an encrypting process is performed, etc.

Incidentally, the system to which the EEPROM according to the present invention is applied, is not limited to such an IC card system as described above.

While the invention made above by the present inventors has been described specifically based on the illustrated embodiments, the present invention is not limited to the above embodiments. It is needless to say that various changes can be made thereto within the scope not departing from the substance thereof.

While the above-described embodiment has described, for example, the case in which the present invention is applied to the EEPROM capable of collectively erasing data and the IC card using it, the present invention can be applied even to other nonvolatile memory such as a flash memory which includes nonvolatile storage elements each having two-layer gates of a floating gate and a control gate and is configured so as to be capable of collectively erasing data, and to a storage media using the nonvolatile memory.

While the above description has been made of the case in which the data "1" corresponds to the erasure and the data "0" corresponds to the writing in the nonvolatile memory according to the above-described embodiment, the data "1" and the data "0" may be associated with the writing and erasure respectively.

Further, while the above embodiment has described the EEPROM in which the threshold value of each memory cell is made high according to the writing and the threshold value is rendered low according to the erasure, the present invention may be applied to a nonvolatile memory wherein the threshold value of the memory cell is rendered low according to the writing and the threshold value is changed high according to the erasure. While the 1-bit memory cell is made up of the storage element (MOSFET Qm) and the select switch element (MOSFET Qs) in the above embodiment, a memory array may be adopted which includes memory cells each having no select switch element and configured so as to be directly connected to a data line DL. Further, while the above embodiment has described the memory which stores 1-bit data per memory cell, a memory may be adopted which stores data of plural bits per memory cell.

INDUSTRIAL APPLICABILITY

While the above-described description has been made of the case in which the present invention has been applied to the EEPROM and the IC card equipped with it, the present invention can be applied even to other nonvolatile memory and an electronic apparatus with the nonvolatile memory built therein

What is claimed is:

1. A nonvolatile memory, comprising:

a power terminal;

a ground terminal;

a plurality of nonvolatile storage elements;

a control circuit; and a boosting circuit for boosting a power supply voltage supplied to the power terminal, wherein a plurality of well regions are connected to back gates of the plurality of nonvolatile storage elements, a high voltage generated by the boosting circuit is applied to back gates of the nonvolatile storage elements to perform writing or erasing, and a magnitude of a load on the boosting circuit varies according to a number of the well regions to which the high voltage is applied upon erasing of each memory cell, and wherein the boosting circuit is controlled so that, regardless of the number of well regions to which the high voltage is applied, a voltage boosting speed at erasure is approximately equal to a voltage boosting speed when the magnitude of the load is large.

2. A nonvolatile memory, comprising:

a power terminal;

a ground terminal;

a plurality of nonvolatile storage elements;

a control circuit; and a boosting circuit for boosting a power supply voltage supplied to the power terminal, wherein a plurality of well regions are connected to back gates of the plurality of nonvolatile storage elements, a high voltage, generated by the boosting circuit, is applied to back gates of the nonvolatile storage elements to perform writing or erasing, and a load on the boosting circuit changes according to a number of the well regions, based on a number of data, to which the high voltage is applied, and wherein the boosting circuit is controlled so that, regardless of the number of data at erasure, a voltage boosting speed is approximately equal to a voltage boosting speed when the load is large.

3. The nonvolatile memory according to claim 2, including a clock generator which generates a plurality of boosting clock signals different in frequency to operate the boosting circuit, and a counting circuit which counts the number of data at the writing or erasure, wherein the boosting circuit is supplied with a boosting clock signal having a frequency corresponding to a result of counting by the counting circuit, thereby controlling the voltage boosting speed.

4. The nonvolatile memory according to claim 2, including a clock generator which generates a boosting clock signal for operating the boosting circuit, and a setting circuit for setting the frequency of the boosting clock signal generated by the clock generator, wherein the clock generator is configured so as to generate the boosting clock signal having a frequency corresponding to a value set to the setting circuit.

5. The nonvolatile memory according to claim 2, including a clock generator which generates an internal clock signal for operating the control circuit, and a setting circuit for setting the frequency of the internal clock signal generated by the clock generator, wherein the clock generator is configured so as to generate the internal clock signal having a frequency corresponding to a value set to the setting circuit.

6. The nonvolatile memory according to claim 1, wherein each of the storage elements has a gate electrode formed over a channel forming region lying between drain and source regions with a three-layered gate insulating film formed of an oxide film, a nitride film and an oxide film being interposed therebetween, and comprises a MOSFET having a MONOS structure wherein electrons or positive holes are accumulated in the nitride film to store information.

7. The nonvolatile memory according to claim 6, wherein, of the storage elements connected to a same word line, one-byte storage elements adjacent to each other are formed on the same well region in the surface of a semiconductor substrate, and the respective well regions are configured so that different voltages are capable of being applied there to.

8. The nonvolatile memory according to claim 7, wherein each of the storage elements has the well region to which a high voltage generated by the boosting circuit is applied when the electrons are injected into the nitride film.

9. The nonvolatile memory according to claim 8, wherein each of the storage elements is configured such that the high voltage generated by the boosting circuit is applied to the gate electrode of each storage element of a word line selected upon the injection of the positive holes into the nitride film, and the high voltage is applied to a well region of each storage element connected to the same word line and subjected to non-selection, to thereby prevent the electrons or positive holes from being injected.

10. A method of controlling a nonvolatile memory having a power terminal, a ground terminal, a plurality of nonvolatile storage elements, a control circuit, and a boosting circuit for boosting a power supply voltage supplied to the power terminal, wherein a high voltage generated by the boosting circuit is applied to back gates of the nonvolatile storage elements to perform writing or erasing, and a load on the boosting circuit varies according to a number of data upon writing or erasing of each memory cell, comprising steps of:

counting the number of data at writing or erasure;

selecting a boosting clock signal, applied to the boosting circuit, according to the number of the data; and controlling a voltage boosting speed so as to be approximately the same regardless of the number of the data.

11. The nonvolatile memory according to claim 2, wherein each of the storage elements has a gate electrode formed over a channel forming region lying between drain and source regions with a three-layered gate insulating film formed of an oxide film, a nitride film and an oxide film being interposed therebetween, and comprises a MOSFET having a MONOS structure wherein electrons or positive holes are accumulated in the nitride film to store information.

12. The nonvolatile memory according to claim 11, wherein of the storage elements connected to a same word line, one-byte storage elements adjacent to each other are formed on the same well region in the surface of a semiconductor substrate, and the respective well regions are configured so that different voltages are capable of being applied thereto.

13. The nonvolatile memory according to claim 12, wherein each of the storage elements has the well region to which a high voltage generated by the boosting circuit is applied when the electrons are injected into the nitride film.

14. The nonvolatile memory according to claim 13, wherein each of the storage elements is configured such that the high voltage generated by the boosting circuit is applied to the gate electrode of each storage element of a word line selected upon the injection of the positive holes into the nitride film, and the high voltage is applied to a well region of each storage element connected to the same word line and subjected to non-selection, to thereby prevent the electrons or positive holes from being injected.

15. A nonvolatile memory, comprising:

a power terminal;

a ground terminal;

a plurality of nonvolatile storage elements having back gates;

a plurality of well regions connected to the back gates;

a control circuit;

a boosting circuit to boost a power supply voltage supplied to the power terminal;

a clock generator to generate a plurality of boosting clock signals, each different in frequency, to operate the boosting circuit;

a counting circuit to count a number of data at writing or erasure; and wherein:

a high voltage, generated by the boosting circuit, is applied to the back gates to perform writing or erasing, a load on the boosting circuit changes according to a number of the well regions, based on the number of data, to which the high voltage is applied, the boosting circuit is controlled so that, regardless of the number of data at erasure, a voltage boosting speed is approximately equal to a voltage boosting speed when the load is large, the voltage boosting speed is externally changeable, and the boosting circuit is supplied with a boosting clock signal having a frequency corresponding to a result of counting by the counting circuit, thereby controlling the voltage boosting speed.

16. The nonvolatile memory according to claim 1, wherein the voltage boosting speed is externally changeable.

17. The nonvolatile memory according to claim 2, wherein the voltage boosting speed is externally changeable.

* * * * *